(12) United States Patent
Chen et al.

(10) Patent No.: US 9,673,800 B2
(45) Date of Patent: Jun. 6, 2017

(54) ANALOG SWITCH CIRCUIT APPLICABLE TO HIGH FREQUENCY SIGNAL

(71) Applicant: REALTEK SEMICONDUCTOR CORP., Hsinchu (TW)

(72) Inventors: Guan-Yu Chen, Taichung (TW); Leaf Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/048,820

(22) Filed: Feb. 19, 2016

(65) Prior Publication Data

US 2016/0261263 A1 Sep. 8, 2016

(30) Foreign Application Priority Data

Mar. 5, 2015 (TW) .............................. 104107065 A

(51) Int. Cl.
*H03K 3/01* (2006.01)
*H03K 17/06* (2006.01)

(52) U.S. Cl.
CPC ....... *H03K 17/06* (2013.01); *H03K 2017/066* (2013.01); *H03K 2217/0018* (2013.01); *H03K 2217/0054* (2013.01)

(58) Field of Classification Search
CPC ........... H03K 17/06; H03K 2217/0054; H03K 2217/0018; H03K 2017/066
See application file for complete search history.

(56) References Cited

U.S. PATENT DOCUMENTS

| 5,448,198 | A | * | 9/1995 | Toyoshima | ......... H01L 27/0218 257/E27.11 |
| 5,610,533 | A | | 3/1997 | Arimoto et al. | |
| 5,689,209 | A | | 11/1997 | Williams et al. | |
| 5,767,733 | A | | 6/1998 | Grugett | |
| 5,786,724 | A | | 7/1998 | Teggatz | |
| 5,880,620 | A | | 3/1999 | Gitlin et al. | |
| 6,094,088 | A | | 7/2000 | Yano | |

(Continued)

FOREIGN PATENT DOCUMENTS

CN 101053157 A 10/2007
TW 201414071 A 4/2014
(Continued)

*Primary Examiner* — Kenneth B Wells
(74) *Attorney, Agent, or Firm* — Muncy, Geissler, Olds & Lowe, P.c.

(57) ABSTRACT

An analog switch circuit is disclosed. The analog switch circuit includes a MOSFET and a control switch. The MOSFET includes a drain electrode, a source electrode, a gate electrode, and a body electrode. A gate bias is applied on the gate electrode to control whether the MOSFET is ON or OFF. The control switch includes a control terminal, a first terminal, a second terminal, and a third terminal. A control bias relating to the gate bias is applied to the control terminal so that the first terminal is connected to the second terminal when the MOSFET is ON, and the first terminal is connected to the third terminal when the MOSFET is OFF. The second terminal is connected to a first voltage source providing a first bias. The third terminal is connected to a second voltage source providing a second bias different from the first bias.

7 Claims, 4 Drawing Sheets

(56) References Cited

U.S. PATENT DOCUMENTS

| | | | |
|---|---|---|---|
| 6,191,615 B1* | 2/2001 | Koga | H03K 19/0013 |
| | | | 326/81 |
| 6,281,738 B1 | 8/2001 | Kamiya | |
| 6,741,098 B2* | 5/2004 | Takahashi | H03K 19/0016 |
| | | | 257/E27.067 |
| 7,659,770 B2 | 2/2010 | Teraguchi et al. | |
| 8,729,948 B2 | 5/2014 | Sugiura | |
| 9,379,698 B2* | 6/2016 | Nohra | H03K 17/6872 |
| 2003/0102568 A1* | 6/2003 | Tomishima | G01R 31/31723 |
| | | | 257/777 |
| 2008/0315950 A1 | 12/2008 | Koh et al. | |
| 2010/0176657 A1 | 7/2010 | Ferguson | |

FOREIGN PATENT DOCUMENTS

| | | |
|---|---|---|
| TW | 201419756 A | 5/2014 |
| TW | 201429161 A | 7/2014 |

\* cited by examiner

… (1)

ANALOG SWITCH CIRCUIT APPLICABLE TO HIGH FREQUENCY SIGNAL

CROSS-REFERENCE TO RELATED APPLICATION

This application claims priority from Taiwan Patent Application No. 104107065, filed on Mar. 5, 2015, in the Taiwan Intellectual Property Office, the contents of which are hereby incorporated by reference in their entirety for all purposes.

BACKGROUND OF THE INVENTION

1. Field of the Invention

This application relates to an analog switch circuit, and more particularly, to the optimizing circuit characteristics according to the ON/OFF status of the analog switch circuit.

2. Description of the Related Art

Since a metal-oxide-semiconductor field-effect transistor (MOSFET) can easily be downsized and have superior element characteristics as well as readily-integrated process, a MOSFET is usually disposed as an analog switch when a communication system is in need, where the ON/OFF status of the analog switch can be controlled by a bias applied on a gate electrode of the MOSFET. When the analog switch is ON, a carrier channel (N-type or P-type) forms between a drain electrode and a source electrode of the MOSFET, which is equivalent 20 to a resistor present between the drain electrode and the source electrode. When the analog switch is OFF, no carrier channel or only narrow carrier channel exists between the drain electrode and the source electrode of the MOSFET, which is equivalent to a capacitor present between the drain electrode and the source electrode.

In addition to the gate, drain, and source electrodes, the MOSFET may include a body electrode for further tuning. In conventional designs, only one bias is applied on the body electrode, or only one resistor with constant resistance is connected to the body electrode. However, according to the description above, an ON switch and an OFF switch require two completely different element characteristics. Hence, only providing fixed bias to the body electrode or connecting the body electrode to the resistor with fixed resistance cannot further optimize the analog switch, and better quality for signal transmission cannot be obtained.

SUMMARY OF THE INVENTION

In view of the aforementioned technical problems, the objective of the present invention provides an analog switch circuit, which can achieve the optimization for the switch characteristics.

According to one objective of the present invention, an analog switch circuit adapted for a high frequency signal is provided. The analog switch circuit includes a MOSFET and a control switch. The MOSFET includes a drain electrode, a source electrode, a gate electrode, and a body electrode. A gate bias is applied to the gate electrode to control whether the MOSFET is ON/OFF. The control switch includes a control terminal, a first terminal, a second terminal, and a third terminal. The first terminal is connected to the body electrode. A control bias relating to the gate bias is applied to the control terminal so that the first terminal is connected to the second terminal when the MOSFET is ON, and the first terminal is connected to the third terminal when the MOSFET is OFF. The second terminal is connected to a first voltage source providing a first bias. The third terminal is connected to a second voltage source providing a second bias different from the first bias.

Preferably, the MOSFET may be an N-type metal-oxide-semiconductor field-effect transistor (NMOS), and the first bias is higher than the second bias.

Preferably, the MOSFET may be a P-type metal-oxide-semiconductor field-effect transistor (PMOS), and the first bias is lower than the second bias.

Preferably, the first voltage source may be connected to the second terminal through a first resistor with a first resistance and the second voltage source may be connected to the third terminal through a second resistor with a second resistance lower than the first resistance.

Preferably, the analog switch circuit may further include a signal providing circuit. The signal providing circuit is connected to the drain electrode or the source electrode and provides a high frequency signal with a frequency higher than 4 GHz.

According to another objective of the present invention, an analog switch circuit adapted for a high frequency signal is provided. The analog switch circuit includes a MOSFET and a control switch. The MOSFET includes a drain electrode, a source electrode, a gate electrode, and a body electrode. A gate bias is applied to the gate electrode to control whether the MOSFET is ON/OFF. The control switch includes a control terminal, a first terminal, a second terminal, and a third terminal. The first terminal is connected to the body electrode. A control bias relating to the gate bias is applied to the control terminal so that the first terminal is connected to the second terminal when the MOSFET is ON, and the first terminal is connected to the third terminal when the MOSFET is OFF. The second terminal is connected to a first resistor with a first resistance, and the third terminal is connected to a second resistor with a second resistance lower than the first resistance.

Preferably, the second terminal may be connected to a first voltage source providing a first bias through the first resistor, and the third terminal may be connected to a second voltage source providing a second bias different from the first bias through the second resistor.

Preferably, the MOSFET may be an NMOS, and the first bias is higher than the second bias.

Preferably, the MOSFET may be a PMOS, and the first bias is lower than the second bias.

Preferably, the analog switch circuit may further include a signal providing circuit. The signal providing circuit is connected to the drain electrode or the source electrode and provides a high frequency signal with a frequency higher than 4 GHz.

As mentioned above, the analog switch circuit in accordance with the present invention may have one or more advantages as follows.

1. The analog switch circuit in accordance with the present invention is able to switch the gate bias applied to the gate electrode of the MOSFET so as to change the element characteristics of the MOSFET while the MOSFET is ON/OFF.

2. The analog switch circuit in accordance with the present invention is able to switch the resistance connected to the gate electrode of the MOSFET so as to change the impedance on the drain/source-body path while the MOSFET is ON/OFF.

3. The analog switch circuit in accordance with the present invention is able to switch the gate bias applied to the gate electrode of the MOSFET and the resistance connected to the gate electrode of the MOSFET so as to optimize the element characteristics of the MOSFET while the MOSFET is ON/OFF.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DETAILED DESCRIPTION OF THE PREFERRED EMBODIMENTS

Figure 1:
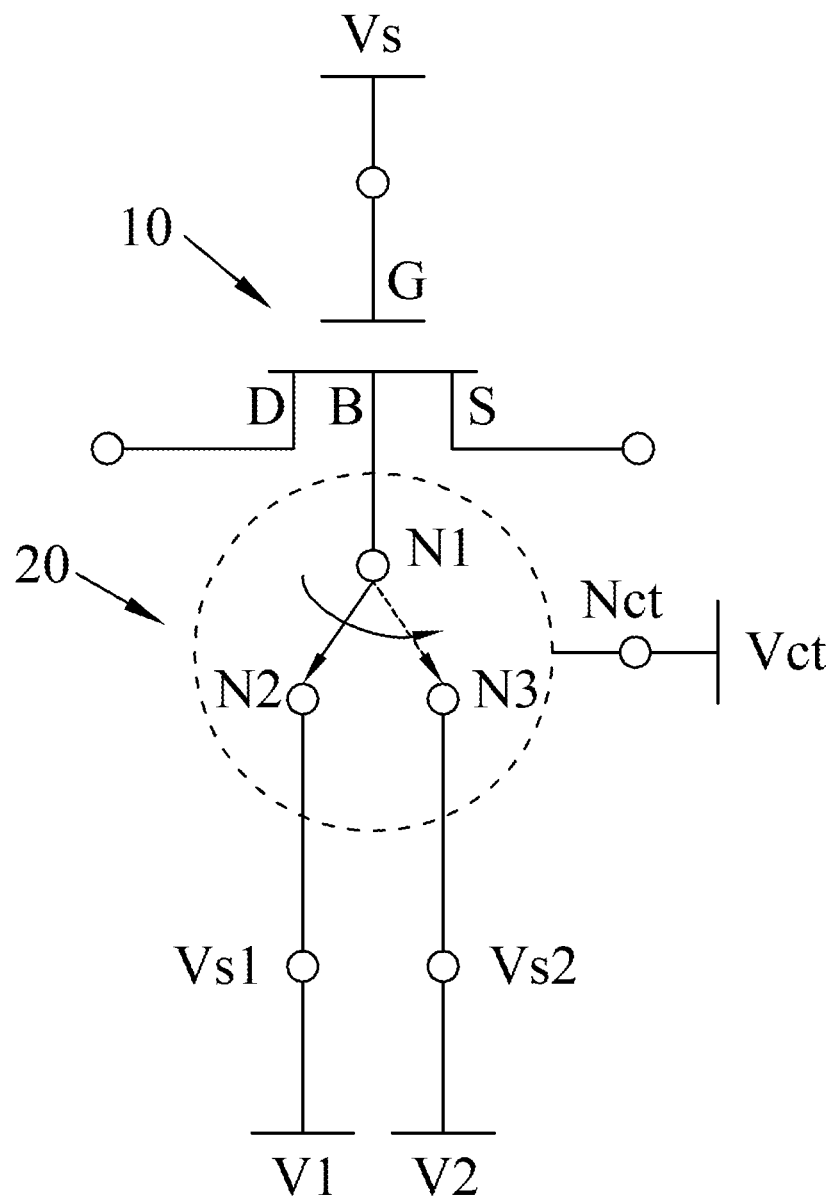
FIG. 1 is a schematic diagram of a first embodiment of the analog switch circuit of the present invention.

Hereinafter, embodiments of the present invention will be described in detail with reference to the accompanying drawings so that those skilled in the art to which the present invention pertains can realize the present invention. As those skilled in the art would realize, the described embodiments may be modified in various different ways, all without departing from the spirit or scope of the present invention.

For better understanding, like elements are designated by like reference numerals in the accompanying drawings and the following description for the embodiments.

Please refer to FIG. 1, which is a schematic diagram of a first embodiment of the analog switch circuit of the present invention. In FIG. 1, the analog switch circuit includes a MOSFET 10 and a control switch 20. The MOSFET 10 includes a drain electrode D, a source electrode S, a gate electrode G, and a body electrode B. A gate bias Vg is applied to the gate electrode G to control whether the MOSFET 10 is ON/OFF. The control switch 20 includes a control terminal Nct, a first terminal N1, a second terminal N2, and a third terminal N3. The first terminal N1 is connected to the body electrode B. A control bias Vct relating to the gate bias Vg is applied to the control terminal Nct so that the first terminal N1 is connected to the second terminal N2 when the MOSFET 10 is ON, and the first terminal N1 is connected to the third terminal N3 when the MOSFET 10 is OFF. The second terminal N2 is connected to a first voltage source Vs1 providing a first bias V1. The third terminal N3 is connected to a second voltage source Vs2 providing a second bias V2 different from the first bias V1.

What should be noted first is that the aforementioned "the MOSFET is ON" means there is a carrier channel (depending on the type of the MOSFET, the carriers are electrons or holes) in an active layer between the drain electrode D and the source electrode S, and "the MOSFET is OFF" means there is no or only very narrow carrier channel existing in an active layer between the drain electrode D and the source electrode S.

In particular, a high frequency signal may be inputted to the drain electrode D and outputted from the source electrode S, or vice versa. That is, for the high frequency signal to be transmitted, one of the drain electrode D and the source electrode S is the signal input, and the other is the signal output. Ideally, when the signal is allowed to be transmitted, the impedance of the signal transmission path (i.e., the path between the drain electrode D and the source electrode S) is low to reduce the signal loss. In contrast, when the signal is prohibited to be transmitted, the impedance of the signal transmission path is ideally high to increase the signal isolation. On the other hand, when the signal is allowed to be transmitted, the impedance of the signal transmission path is ideally low to reduce the insert impedance in the whole circuit due to the switch.

Therefore, in this embodiment, the MOSFET 10 may be an NMOS, and the first bias is higher than the second bias. Since the control bias Vct for controlling the control switch 20 relates to the gate bias Vg applied to the gate electrode G and the gate bias Vg controls whether the MOSFET 10 is ON/OFF, the control switch 20 can determine the connection status of the body electrode B of the MOSFET 10 according to the ON/OFF status of the MOSFET 10. When the MOSFET 10 is ON, the body electrode B is connected to the first voltage source Vs1 and thus has higher bias. When the MOSFET 10 is OFF, the body electrode B is connected to the second voltage source Vs2 and thus has lower bias. As a result, when the MOSFET 10 is ON, the MOSFET 10 has lower threshold voltage (Vth) because of body effect. For example, when the inputted high frequency signal is a small signal, the impedance of the path between the drain electrode D and the source electrode S may relate to the value in inverse proportion to (Vgs−Vth), where Vgs is the bias difference between the gate electrode G and the source electrode S. Here, the impedance of the signal transmission path (i.e., the path between the drain electrode D and the source electrode S) will decrease with the threshold voltage Vth decreasing. In contrast, when the MOSFET 10 is OFF, the MOSFET 10 has higher threshold voltage Vth, and thereby the impedance of the path from the drain electrode D to the source electrode S increases. Hence, in this embodiment, because the bias on the body electrode B of the MOSFET 10 can vary based on the ON/OFF status of the MOSFET 10, the signal transmission path of the analog switch circuit in accordance with this embodiment may have lower impedance while the MOSFET 10 is ON and have higher impedance while the MOSFET 10 is OFF so as to match the requirement for an ideal analog switch. It is worth noting that the embodiments of the present invention also include the cases that the first bias V1 or the second bias V2 equals to 0V. Namely, the first voltage source Vs1 or the second voltage source Vs2 may be substantially a ground terminal. In a preferred embodiment of the present invention, when the MOSFET 10 is NMOS, the first bias V1 is positive (>0V), and the second bias V2 is negative (<0V). What should be noted is that the first bias V1 should not be so large that the drain electrode D or the source electrode S can form short-circuit with the body electrode B. On the other hand, when the MOSFET 10 is ON and the first bias V1 is positive, the depletion region between the signal input and the body electrode B becomes wide, and thus the junction capacitance between the signal input and the body electrode B becomes small so as to increase the cut-off frequency and attenuate the intensity of signal coupled to the body electrode B. Therefore, the signal loss from the body electrode B can be reduced.

Similarly, in some embodiments of the present invention, the MOSFET 10 may be a PMOS, and the first bias V1 is lower than the second bias V2. In general, such embodiments are similar to the embodiments in which the MOSFET 10 is an NMOS except that the polarities of operating biases applied to the electrodes of the MOSFET 10 need to be inversed. Since the first bias V1 is lower than the second bias V2, the signal transmission path still has lower impedance while the MOSFET 10 is ON and has higher impedance while the MOSFET 10 is OFF. In a preferred embodiment of the present invention, when the MOSFET 10 is PMOS, the first bias V1 is negative (<0V), and the second bias V2 is positive (>0V).

Figure 2:
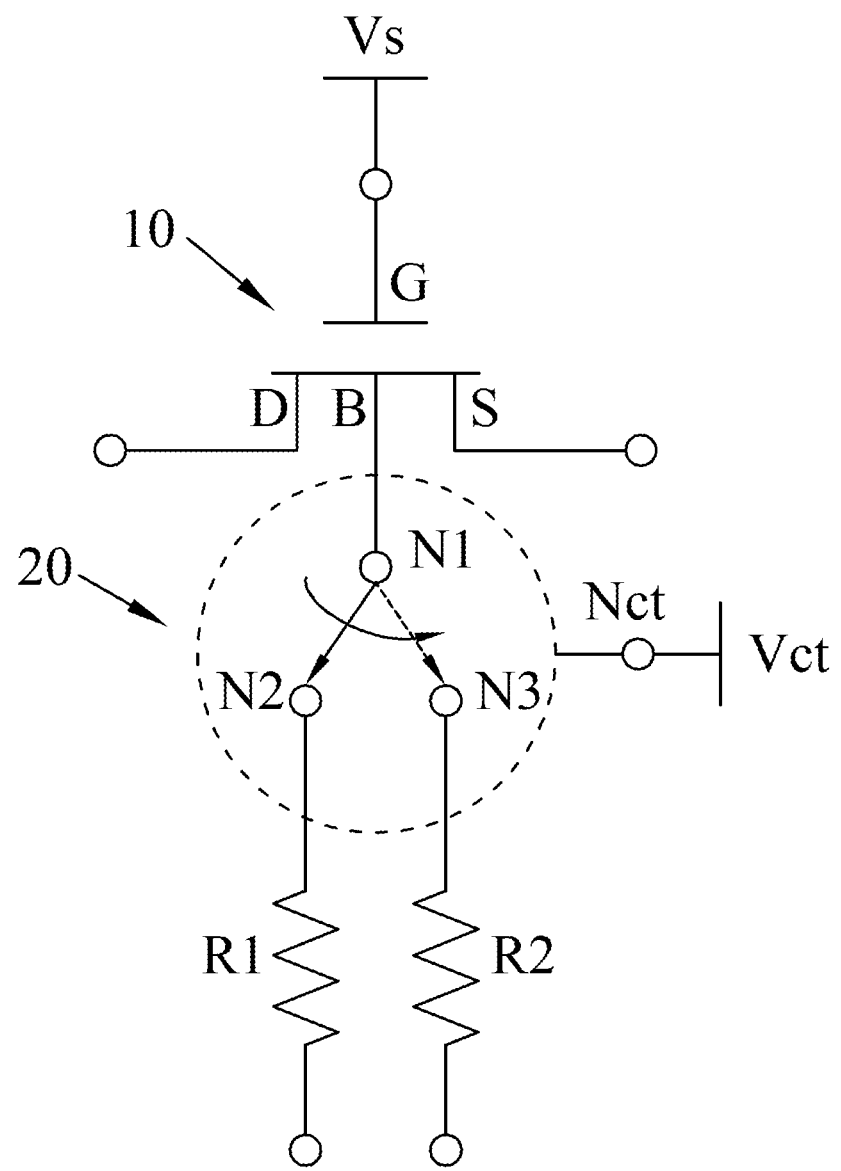
FIG. 2 is a schematic diagram of a second embodiment of the analog switch circuit of the present invention.

Please refer to FIG. 2, which is a schematic diagram of a second embodiment of the analog switch circuit of the present invention. In FIG. 2, the analog switch circuit includes a MOSFET 10 and a control switch 20. The MOSFET 10 includes a drain electrode D, a source electrode S, a gate electrode G, and a body electrode B. A gate bias Vg is applied to the gate electrode G to control whether the MOSFET 10 is ON/OFF. The control switch 20 includes a control terminal Nct, a first terminal N1, a second terminal N2, and a third terminal N3. The first terminal N1 is connected to the body electrode B. A control bias Vct relating to the gate bias Vg is applied to the control terminal Nct so that the first terminal N1 is connected to the second terminal N2 when the MOSFET 10 is ON, and the first terminal N1 is connected to the third terminal N3 when the MOSFET 10 is OFF. The second terminal N2 is connected to a first resistor R1 with a first resistance, and the third terminal N3 is connected to a second resistor R2 with a second resistance lower than the first resistance.

In particular, when the MOSFET 10 is ON, it is desirable for the path between the signal input (the drain electrode D or the source electrode S) and the body electrode B to have high impedance to prevent the signal from sing from through the body electrode B. In contrast, when the MOSFET 10 is OFF, it is desirable for the path between the signal input (the drain electrode D or the source electrode S) and the body electrode B to have low impedance. In that case, since the impedance of the signal transmission path is higher than that of the path between the signal input and the body electrode B, the high frequency signal can easily be transmitted toward the body electrode B and then be absorbed. In other words, the loss of the high frequency signal from the signal input to the signal output can be reduced, and the signal isolation can be improved when the analog switch circuit is OFF.

In this embodiment, to achieve the effect stated above, the body electrode B of the MOSFET 10 can be connected to the resistor with high resistance (the first resistor R1) while the MOSFET 10 is ON and be connected to the resistor with low resistance (the second resistor R2) while the MOSFET 10 is OFF by the control switch 20. The method for controlling the control switch 20 is substantially similar to the first embodiment, and the detail is omitted here. It is worth noting that the embodiments of the present invention include the case that the second resistance of the second resistor R2 is very low. For example, in some embodiments, the second resistor R2 may be the wire to the ground terminal and substantially have resistance close to zero. As a result, the path between the signal input (the drain electrode D or the source electrode S) and the body electrode B has high impedance when the MOSFET 10 is ON, and the path between the signal input and the body electrode B has low impedance when the MOSFET 10 is OFF, which can achieve the effect of an ideal analog switch.

Figure 3:
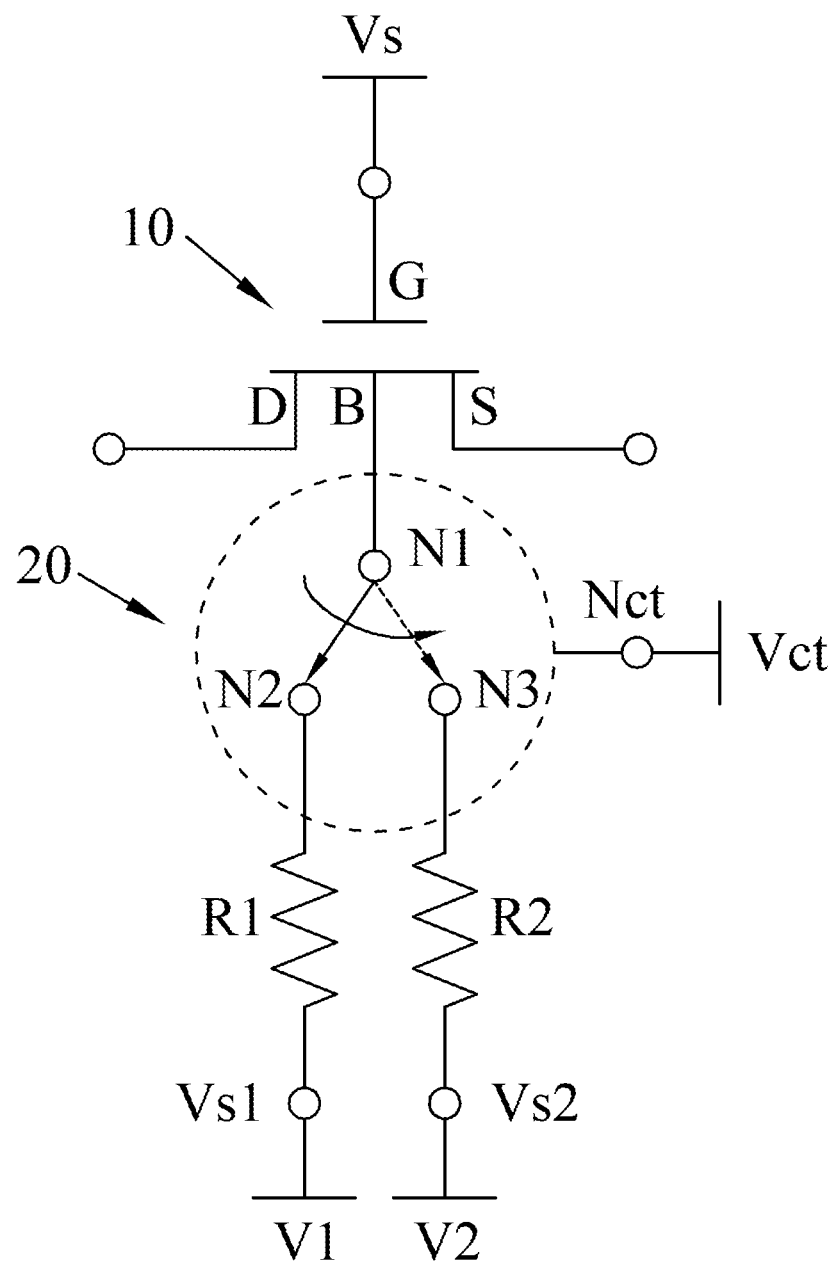
FIG. 3 is a schematic diagram of a third embodiment of the analog switch circuit of the present invention.

Please refer to FIG. 3, which is a schematic diagram of a third embodiment of the analog switch circuit of the present invention. In this embodiment, the analog switch circuit may have the features of the analog switch circuits of both the first and second embodiments. In FIG. 3, when the MOSFET 10 is ON, the body electrode B of the MOSFET 10 may be connected to the first voltage source Vs1 providing the first bias V1 through the first resistor R1 with the first resistance (higher resistance). In contrast, when the MOSFET 10 is OFF, the body electrode B of the MOSFET 10 may be connected to the second voltage source Vs2 providing the second bias V2 through the second resistor R2 with the second resistance (lower resistance). In this embodiment, the MOSFET 10 may be NMOS, and the first bias V1 is higher than the second bias V2. Preferably, the first bias V1 is positive, and the second bias V2 is negative.

Therefore, when the MOSFET is ON, the signal transmission path from the signal input to the signal output may have low impedance due to the body effect, and the path from the signal input to the body electrode B may have high impedance due to the first resistor R1 with high resistance. When the MOSFET is OFF, the signal transmission path from the signal input to the signal output may have high impedance due to the body effect, and the path from the signal input to the body electrode B may have low impedance due to the second resistor R2 with low resistance. As a result, when the MOSFET 10 is ON, the high frequency signal is prone to be transmitted on the signal transmission path with low impedance, and the loss of the signal by being coupled to the body electrode B can be reduced. In contrast, when the MOSFET 10 is OFF, the high frequency signal is prone to be transmitted on the signal-input-to-body-electrode path with low impedance, and the signal isolation between the two ends of the signal transmission path can be improved.

Figure 4:
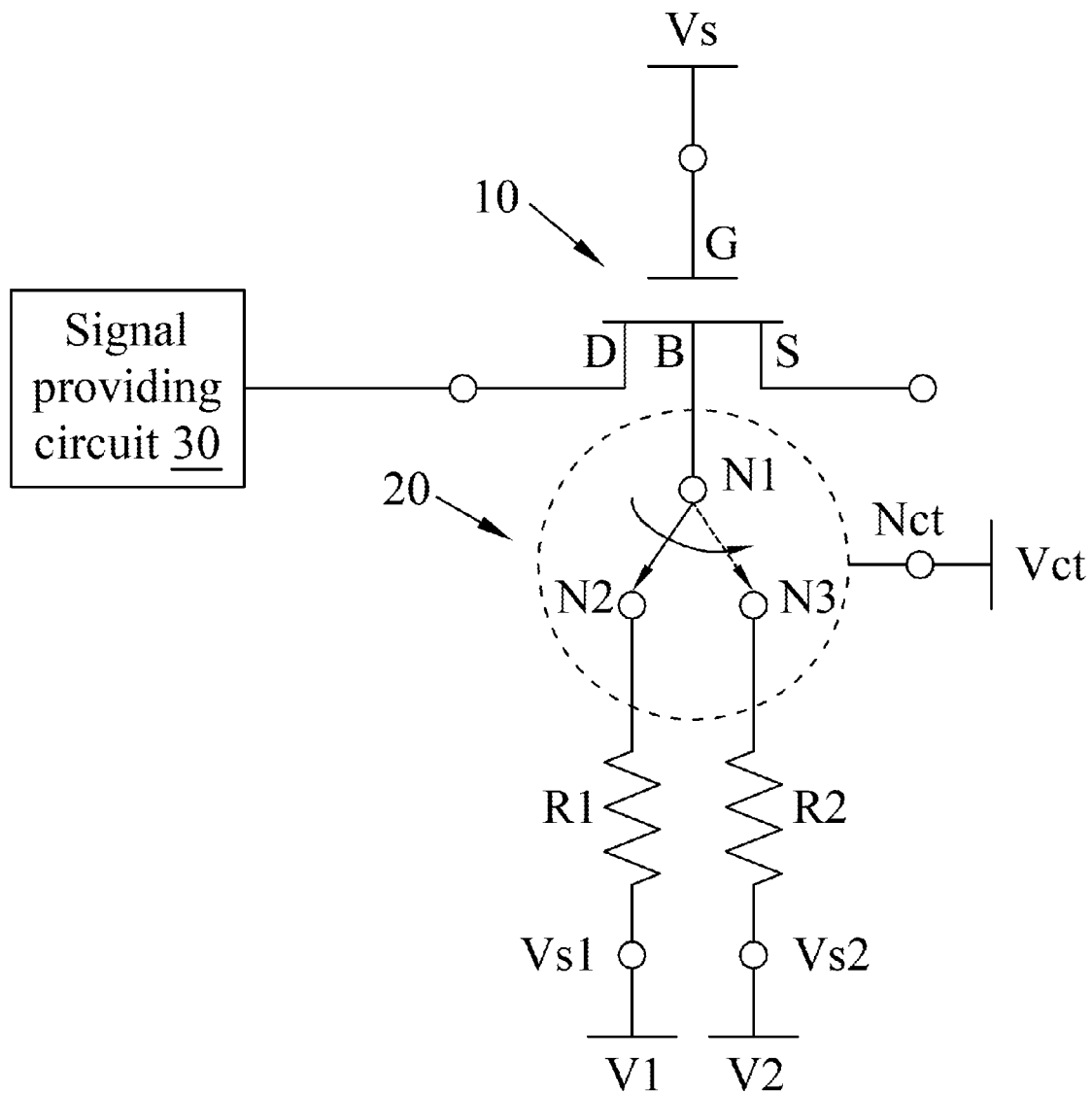
FIG. 4 is a schematic diagram of a fourth embodiment of the analog switch circuit of the present invention.

Please refer to FIG. 4, which is a schematic diagram of a fourth embodiment of the analog switch circuit of the present invention. In FIG. 4, the analog switch signal may further include the signal providing circuit 30. The signal providing circuit 30 is connected to the drain electrode D of the MOSFET 10 and provides a high frequency signal with frequency higher than 4 GHz. In this embodiment, the drain electrode D of the MOSFET 10 is the signal input. In another embodiment, the signal providing circuit 30 may be connected to the source electrode S of the MOSFET 10 and the source electrode S is the signal input.

In case that the input signal is a low frequency signal, since the parasite capacitance formed between the electrodes of the MOSFET 10 are still high for the input signal, the signal isolation is relatively good and thus the effect of the analog switch circuit is not apparent. However, in the case the input signal is a high frequency signal, particularly in the case that the frequency of the input signal is higher than 4 GHz, it is highly likely for the input signal to be coupled to the ground or other electrodes via the parasite capacitance. Therefore, when the signal input (the drain electrode D or the source electrode S) of the MOSFET 10 of the embodiment of the present invention is connected to the signal providing circuit 30, the characteristics of the signal transmission path and the path between the signal input and the body electrode B can be effectively improved with respect to the high frequency signal having frequency higher than 4 GHz so as to optimize the impedance of the paths according to the ON/OFF status of the MOSFET 10. Preferably, the signal providing circuit may provide a high frequency signal with frequency higher than 5 GHz, where the effect of the analog switch circuit of the embodiment of the present invention becomes more manifest.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. An analog switch circuit, applicable to a high frequency signal, comprising:
    a metal-oxide-semiconductor field-effect transistor, comprising a drain electrode, a source electrode, a gate electrode, and a body electrode, wherein a gate bias is applied to the gate electrode to control whether the metal-oxide-semiconductor field-effect transistor is ON or OFF; and
    a control switch, comprising a control terminal, a first terminal, a second terminal, and a third terminal, the first terminal connected to the body electrode, wherein a control bias relating to the gate bias is applied to the control terminal, so that the first terminal is connected to the second terminal when the metal-oxide-semiconductor field-effect transistor is ON, and the first terminal is connected to the third terminal when the metal-oxide-semiconductor field-effect transistor is OFF;
    wherein the second terminal is connected to a first resistor with a first resistance, and the third terminal is connected to a second resistor with a second resistance lower than the first resistance.

2. The analog switch circuit of claim 1, wherein the second terminal is connected to a first voltage source providing a first bias through the first resistor, and the third terminal is connected to a second voltage source providing a second bias different from the first bias through the second resistor.

3. The analog switch circuit of claim 2, further comprising:
    a signal providing circuit, connected to the drain electrode or the source electrode and providing a high frequency signal with a frequency higher than 4 GHz.

4. The analog switch circuit of claim 2, wherein the metal-oxide-semiconductor field-effect transistor is an N-type metal-oxide-semiconductor field-effect transistor, and the first bias is higher than the second bias.

5. The analog switch circuit of claim 4, further comprising:
    a signal providing circuit, connected to the drain electrode or the source electrode and providing a high frequency signal with a frequency higher than 4 GHz.

6. The analog switch circuit of claim 2, wherein the metal-oxide-semiconductor field-effect transistor is a P-type metal-oxide-semiconductor field-effect transistor, and the first bias is lower than the second bias.

7. The analog switch circuit of claim 6, further comprising:
    a signal providing circuit, connected to the drain electrode or the source electrode and providing a high frequency signal with a frequency higher than 4 GHz.

* * * * *